(12) United States Patent
Weber

(10) Patent No.: US 6,421,492 B1
(45) Date of Patent: Jul. 16, 2002

(54) WAVEGUIDE

(75) Inventor: Jean-Pierre Weber, deceased, late of Stockholm (SE), by Erling Blommé & Tomas Landahl legal representative

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/092,072

(22) Filed: Jun. 5, 1998

(30) Foreign Application Priority Data

Jun. 6, 1997 (GB) .............................................. 9711835

(51) Int. Cl.⁷ ................................................. G02B 6/00
(52) U.S. Cl. ....................................................... 385/131
(58) Field of Search ............................. 385/24, 27, 31, 385/39, 47, 48, 131

(56) References Cited

U.S. PATENT DOCUMENTS

| | | | |
|---|---|---|---|
| 4,821,276 A | | 4/1989 | Alphonse et al. |
| 4,999,591 A | * | 3/1991 | Koslover et al. ......... 333/21 R |
| 5,199,092 A | * | 3/1993 | Stegmueller ................. 385/50 |
| 5,278,926 A | * | 1/1994 | Doussiere .................... 385/50 |
| 5,528,708 A | * | 6/1996 | van der Tol .................. 385/28 |
| 5,574,808 A | * | 11/1996 | van der Tol .................. 385/28 |
| 5,764,825 A | * | 6/1998 | Mugino et al. ............... 385/24 |
| 5,883,992 A | * | 3/1999 | Gonthier ...................... 385/43 |
| 6,162,655 A | * | 12/2000 | Johnson et al. .............. 438/31 |

FOREIGN PATENT DOCUMENTS

| | | |
|---|---|---|
| EP | 0386797 | 9/1990 |
| GB | 2294361 | 4/1996 |
| GB | 2309581 | 7/1997 |
| WO | WO 9106552 | 5/1991 |
| WO | WO 9523445 | 8/1995 |

OTHER PUBLICATIONS

Electronics Letter "Compact InGaAsP/InP laser diodes with integrated mode expander for efficient coupling to flat-ended singlemode fibres", T.Brenner et al., Aug. 17, 1995, vol. 31, No. 17, pp. 1,2, and 14.

Electronics Letters "Wavelength tunable in–line Fabry–Perot las with lateral–grating assisted vertical codirectional coupled filter", M. Okai et al., Jan. 2, 1997, vol. 33, No. 1, pp. 59–61.

IEEE Photonics Technology Letters, "Comparison of Coupling Characteristics for Several Spotsize–Converter–Integrated Laser Diodes in the 1.3–$\mu$m–Wavelength Region", Kenji Kawano et al., vol. 9, No. 4, Apr. 1997, pp. 420–430.

* cited by examiner

*Primary Examiner*—Akm E. Ullah
(74) *Attorney, Agent, or Firm*—Burns, Doane, Swecker & Mathis, L.L.P.

(57) ABSTRACT

The present invention is directed toward an optical device for transferring light power from a laser to an optical fiber with a minimal loss of light at the coupling of the laser with the optical fiber. The device comprises a first, passive waveguide and a second, active waveguide wherein the power of the laser light signal is transferred from the second waveguide to the first waveguide. The width of the end of the active waveguide has a diagonal end face that tapers asymmetrically down to zero, which provides for a transfer of light power from the active waveguide to the passive waveguide.

5 Claims, 2 Drawing Sheets

WAVEGUIDE

This application claims priority under 35 U.S.C. §§119 and/or 365 to 9711835.0 filed in Britain on Jun. 6, 1997; the entire content of which is hereby incorporated by reference.

BACKGROUND OF THE INVENTION

The present invention relates to a semiconductor optical device, such as a laser, and to a method of fabrication thereof, which allows low-loss coupling to an optical fibre.

DESCRIPTION OF THE PRIOR ART

Semiconductor optical components, such as semiconductor lasers, are widely used. In use, it is often necessary to couple such components to external optical elements. For example, in the case of a semiconductor laser producing a coherent light output, it may be necessary to couple the device to an optical fibre, along which the light is to be directed.

One problem which arises with such coupling is that there can be high losses (up to 10 dB), arising from the different optical modes which exist in the laser and in the fibre. Typically, the optical fibre has a circularly symmetric mode, with a Full Width Half-Max (FWHM) of the order of 7 μm, while the mode in the laser is usually elliptical, with the ratio of the major axis to the minor axis being about 2:1, and with the FWHM being about 1 μm.

One solution to this problem is to use lenses, but this is expensive, and is not usually practical if it is desired to make an array of lasers. Ideally, it should be possible simply to place the end of the fibre against the output face of the laser, and join them using butt-joint coupling.

If this is to be possible, the mode size at the output of the laser must be increased, so that it is a better match to the mode within the fibre. One such proposal is disclosed in U.S. Pat. No. 5,278,926. In this document, it is proposed that the semiconductor optical component should include two buried heterostructure optical waveguides, namely an active waveguide and a passive waveguide which are superposed over at least a part of their lengths, the transverse cross-sectional area of the active waveguide decreasing over a mode transition region to couple a narrow optical mode, which is guided by the active waveguide, to a wide mode, which is guided by the passive waveguide.

One object of the present invention is to provide a fabrication process which allows relatively easy manufacture of an optical component such as a laser, which may be coupled to an optical fibre.

A further object of the invention is to define a structure which allows easy coupling to an optical fibre.

The present invention relates to a method of fabricating the semiconductor laser which allows the use of standard fabrication techniques, without requiring particularly tight manufacturing tolerances. Moreover, the invention relates to the structure made by this fabrication process. In particular, there is also disclosed a structure with an asymmetrically tapered waveguide.

DETAILED DESCRIPTION OF THE PREFERRED EMBODIMENTS

Figure 1:
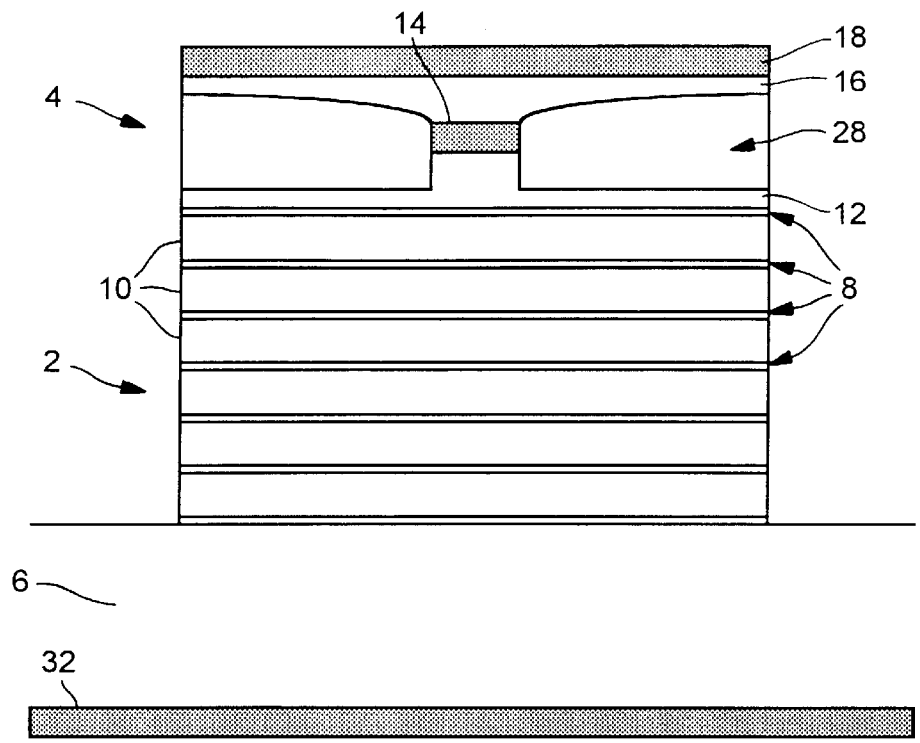
FIG. 1 is a cross-sectional view through a component in accordance with the invention.
Figure 2:
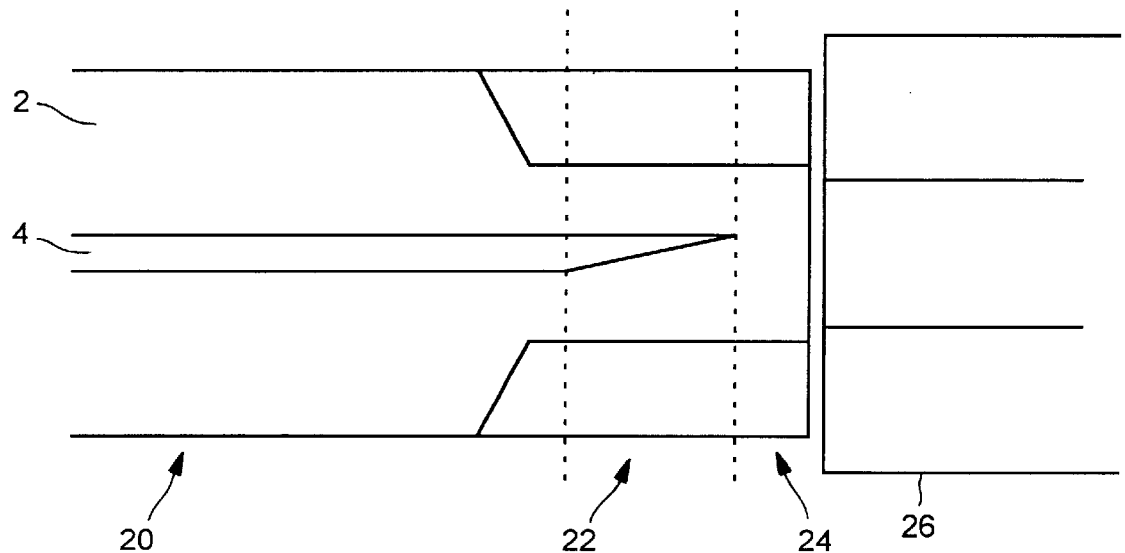
FIG. 2 is a plan view of the component shown in FIG. 1.

FIGS. 1 and 2 are, respectively, a cross-sectional view and a plan view of a semiconductor laser component in accordance with the invention. A process for fabricating the device will now be described. This will be with reference to a laser at 1.55 μm, having a bulk active layer. It will be appreciated that the active layer could also be formed of quantum wells or strained quantum wells. All of the materials are lattice-matched. In the following description, all of the growth steps are advantageously carried out using Metal Organic Chemical Vapour Deposition (MOCVD), although it will be appreciated that other growth techniques may be used.

The first stage in the fabrication process is epitaxial growth of the layers which form the passive waveguide 2 and the active waveguide 4. In this example, the substrate 6 is n-doped InP, and the passive waveguide 2, which is also n-doped, is formed on the substrate in a number of layers. Each layer comprises passive waveguide material 8, in the form of a 40 nm layer of InGaAsP with a 1.0 μm band gap, and cladding material 10, in the form of a 660 nm layer of InP. FIG. 1 shows a passive waveguide having seven such layers, but the number of layers may be eight, or nine, or indeed any convenient number.

On top of the uppermost layer of passive waveguide material 8, there is grown a 460 nm layer of n-doped InP 12, followed by the active layer 14, which is formed from 0.2 μm undoped InGaAsP, with 1.58 μm band gap. A further cladding layer 16, formed from p-doped InP and of thickness of about 200 nm is then grown on the active layer.

The next stage in the fabrication process involves the formation of an asymmetric taper in the active waveguide 4, in the second region 22 shown in FIG. 2. This taper is formed by etching diagonally through the active layer. In the finished product, the taper, and hence the second region 22, might for example extend over a length in the region from 50 μm to several hundred μm. This means that the diagonal etch must be at an angle of about 0.003–0.03 radians to the waveguide direction. The etch is through the active layer 14, down to the uppermost n-InP layer.

Then, selective regrowth with semi-insulating (Fe-doped) InP is used to form current blocking layers 28 to fill the etched regions and planarise the wafer. Alternatively, n-P InP can be used for the current blocking layers.

Figure 3:
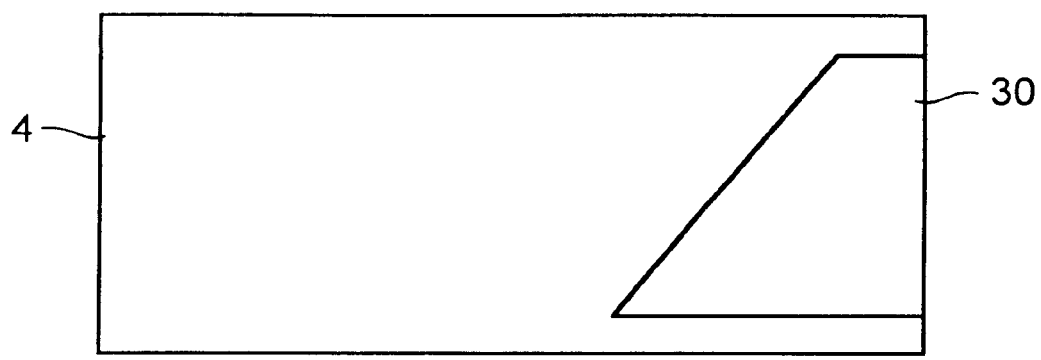
FIG. 3 is a plan view of the component during fabrication.

FIG. 3 is a plan view of the device at this stage, showing the diagonal etch through the active guide layer 4, and the regrowth of semi-insulating InP 30. (The angle of the diagonal etch is greatly exaggerated in FIG. 3 for ease of illustration).

The next fabrication stage is the formation of a standard buried heterostructure layer, that is the formation of the active waveguide itself, with a width of about 1.2 μm by etching through the active layer, down into the uppermost n-InP layer. It will be noted that this also extends into the region which was etched and refilled with semi-insulating InP in the previous stage. The reason for regrowing the semi-insulating material was to obtain a planar surface for easy lithography while defining the active waveguide. The result is that an asymmetric taper can be obtained without having to form sharp points by lithography, and without constructing any free-standing thin points at any stage during processing, as these are susceptible to breakage.

Figure 4:
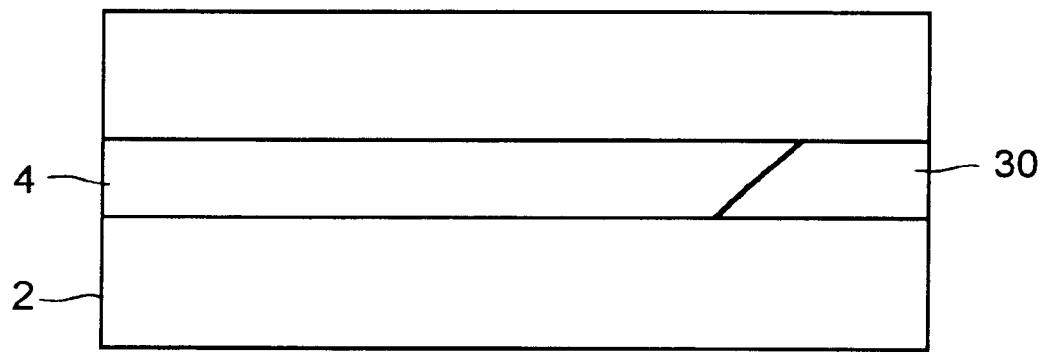
FIG. 4 is a plan view of the component at a later point during fabrication.

FIG. 4 is a plan view of the device following the definition of the active waveguide. At this stage, it is possible to see the active waveguide 4, the regrown semi-insulating material 30, and the passive waveguide 2 in the areas where the active layer has been etched away.

Following definition of the active waveguide, a standard current blocking structure 28 is formed from p-n InP, or from semi-insulating (Fe doped) InP.

To complete the buried heterostructure layer, a p-InP cladding 16 is grown over the whole structure, and a p-InGaAs layer 18 is formed to provide good ohmic contact to the top metal layer which acts as the contact.

The next step is the definition of a large ridge waveguide around the region where the active layer has been etched away (including the taper region), as shown in FIGS. 1 and 2. The waveguide is of the order of 11 μm wide, centred on the active waveguide, and is defined by etching away all the regrown material down to the substrate.

A bottom contact 32 is formed by metallisation of the substrate surface. The laser facets can then be formed by cleaving or etching, and can eventually be coated. The whole structure may be covered by SiN, although the performance is the same if air is used as the outer dielectric material.

This structure can be used for a Fabry-Perot laser, in which case mirrors are provided on the end facets of the cavity, which may be cleaved or etched and may be coated or uncoated. Alternatively, the structure may be used for a DFB laser, although, in this case, additional steps are required before formation of the contact layer 18 to make the required gratings, and an anti-reflection coating is then applied to the facets.

As mentioned previously, FIG. 2 is a plan view of the semiconductor laser device in accordance with the invention. The device can be considered to be divided into three regions. In a first region 20, the device has a normal laser structure, though with a passive waveguide 2 and an active waveguide 4. In this region, nearly all of the power is confined to the active waveguide 4. In a second region 22, the active waveguide is tapered down to zero, which leads to an adiabatic transfer of the power from the active guide to the passive guide 2. Finally, in the third region 24, the power is confined to the large passive guide, which has a mode which can be well matched to an optical fibre 26, to which the laser is to be coupled.

In the first region 20 of the device, the ridge is not etched, in order to avoid formation of another guided mode. However, in the second and third regions, i.e. at the output side of the laser, the ridge waveguide is formed by etching through the whole structure, down to the substrate, to define the large passive ridge waveguide, which preferably has a width of about 11 μm. It should be noted that neither the width of the ridge waveguide, nor indeed the width of the active region, are critical, which allows good manufacturing tolerances. The thickness of the layers, which are also not critical, can be controlled much more accurately than the widths of the layers.

What is claimed is:

1. A method of fabricating a semiconductor device, comprising:

forming a passive waveguide from a plurality of alternating layers of passive guide material and cladding material on a substrate;

forming an active region on the passive waveguide;

etching the material of the active region to form a diagonal end face thereof in a first end region of the device;

regrowing semi-insulating material to replace the material removed by etching the material of the active region;

etching the material of the active region and the regrown semi-insulating material to define an active waveguide;

growing current blocking layers to replace the material removed by etching the material of the active region and the regrown semi-insulating material; and etching all the regrown material down to the substrate to define a ridge waveguide in the said first end region.

2. A semiconductor optical device, comprising:

a passive waveguide, formed from a plurality of alternating layers of passive guide material and cladding material on a substrate, and defining a ridge waveguide in a first end region of the device;

an active waveguide, formed on the passive waveguide, the material of the active waveguide having a diagonal end face; and current blocking layers around the active waveguide.

3. A semiconductor optical device, comprising:

a first region, including an active waveguide and a passive waveguide, a width of the active waveguide being such that the active waveguide is adapted to receive an input light signal;

a second region, including the active waveguide and the passive waveguide, the width of the active waveguide asymmetrically tapering, such that power in the input light signal is transferred to the passive waveguide; and a third region, including the passive waveguide, and being adapted to produce an output light signal therefrom.

4. A semiconductor optical device as claimed in claim 3, wherein the passive waveguide is in the form of a ridge waveguide.

5. A semiconductor optical device as claimed in claim 3, wherein the width of the active waveguide asymmetrically tapers to zero.

* * * * *